United States Patent
Verbanets (10) Patent No.: US 9,513,315 B2
(45) Date of Patent: Dec. 6, 2016

(54) ELECTRO OPTICAL VOLTAGE TRANSDUCER SIGNAL PROCESSING SYSTEM

(71) Applicant: ABB Technology AG, Zurich (CH)

(72) Inventor: William R. Verbanets, Pittsburgh, PA (US)

(73) Assignee: ABB SCHWEIZ AG (CH)

( * ) Notice: Subject to any disclaimer, the term of this patent is extended or adjusted under 35 U.S.C. 154(b) by 0 days.

(21) Appl. No.: 14/422,417

(22) PCT Filed: Aug. 20, 2013

(86) PCT No.: PCT/US2013/055762
§ 371 (c)(1),
(2) Date: Feb. 19, 2015

(87) PCT Pub. No.: WO2014/031620
PCT Pub. Date: Feb. 27, 2014

(65) Prior Publication Data
US 2015/0212118 A1    Jul. 30, 2015

Related U.S. Application Data

(60) Provisional application No. 61/691,306, filed on Aug. 21, 2012.

(51) Int. Cl.
*G01R 15/24* (2006.01)
(52) U.S. Cl.
CPC ........... *G01R 15/241* (2013.01); *G01R 15/247* (2013.01)
(58) Field of Classification Search
CPC .......................... G01R 15/241; G01R 15/247
See application file for complete search history.

(56) References Cited

U.S. PATENT DOCUMENTS 6,362,615 B1 * 3/2002 Davidson ............. G01R 15/242
324/754.27

FOREIGN PATENT DOCUMENTS

EP    0361832 A2    4/1990
EP    1310802 A2    5/2003

OTHER PUBLICATIONS

Pascal, J. et al.: "Optimization of an Electro-Optic Voltage Transducer using a VHDL-AMS model", Procedia Engineering, vol. 25, 2011, pp. 59-62, XP028436474, ISSN: 1877-7058, DOI: 10.1016/J.ProEng.2011.12.015.
Zhang, C. et al.: "Quasi reciprocal reflective optical voltage sensor based on Pockels effect with digital closed-loop detection technique" Optics Communication, North Holland, Publishing Co. Amsterdam, NL vol. 283, No. 20, Oct. 15, 2010, pp. 3878-3883, XP027212315, ISSN: 0030-4018.

* cited by examiner

*Primary Examiner* — David Gray
*Assistant Examiner* — Michael Harrison
(74) *Attorney, Agent, or Firm* — Taft Stettinius & Hollister LLP (57) ABSTRACT

A system that measures a high electric voltage on an electrical transmission line has an electro optical voltage transducer sensor connected between the electrical transmission line and ground for providing in response to the measured high electric voltage a Sin optical intensity signal and a Cos optical intensity signal. The system also has a signal processor that operates in a first state to digitally process samples of the Sin and said Cos optical intensity signals. The process samples are used to provide a representation of the high electric voltage on the transmission line. The representation can be used for one or more of metering, relaying and transient capture.

12 Claims, 8 Drawing Sheets

ELECTRO OPTICAL VOLTAGE TRANSDUCER SIGNAL PROCESSING SYSTEM

FIELD OF THE INVENTION

This invention relates to electro-optical voltage transducer ("EOVT") systems for measuring high electric voltages such as those in an electrical transmission system.

DESCRIPTION OF THE PRIOR ART

EOVT systems are known. One example of such a system is described in U.S. Pat. No. 4,904,931 ("the '931 patent").

Figure 1:
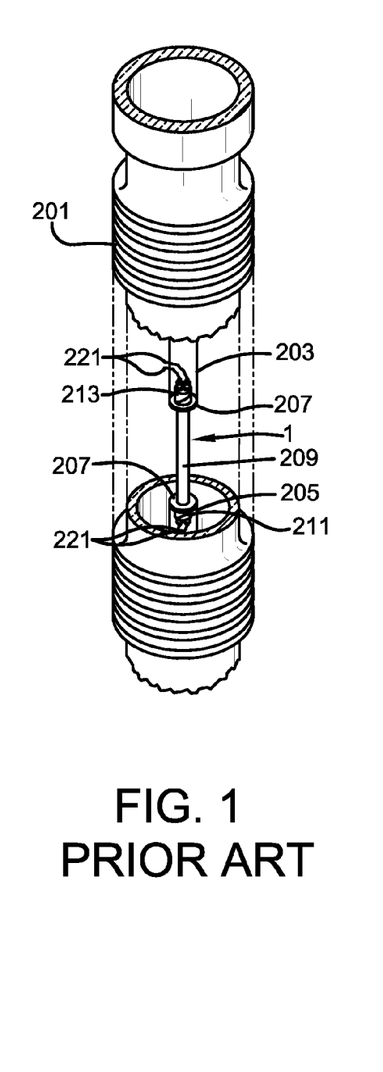
FIG. 1 shows an isometric view with a part broken away of a prior art apparatus for measuring line to ground voltages in a high voltage electric power transmission system.
Figure 2:
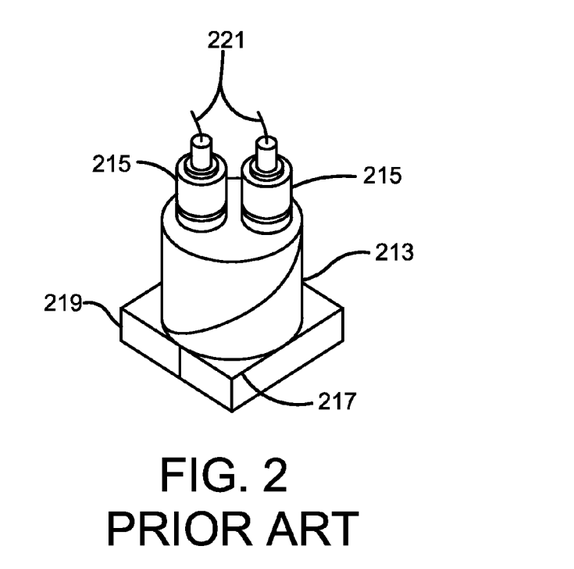
FIG. 2 shows an enlargement of a subassembly of FIG. 1.
Figure 3:
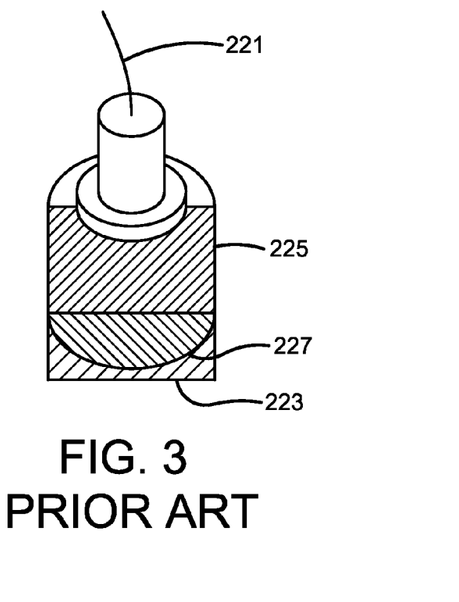
FIG. 3 shows a vertical section through a component which is part of the subassembly of FIG. 2.

Referring now to FIGS. 1 through 3 which are respectively FIGS. 6 through 8 in the '931 patent there is shown a practical embodiment of a sensor 1, mounted in an insulation column 201 which is cut away to show the mounting of the sensor, that can be used in the system described in the '931 patent. An upper supporting tube 203 is connected to a transmission line (not shown) and a lower supporting tube 205 is connected to ground. Both tubes are electrically conducting and provide contact between the ends to the sensor 1 and the line and ground respectively through mounting discs 207 constructed from electrically conducting transparent material such as NESA glass. Crystal 209 and the polarizers 211 and 213 are made with a circular cross section.

As shown more clearly in FIG. 2 for the second polarizer 213, two cylindrical collimators 215 are mounted on one flat end face of the cylindrical polarizer and rectangular one-eighth wave plates 217 and 219 are mounted against the opposite end. The collimators 215, which focus the light beams received from the second polarizer 213 on the optic fiber cables 221, are shown broken away in FIG. 3. Each collimator 215 is formed from two pieces 223 and 225 of low refractive index glass, such as fused silica and one piece of high index glass 227 such as SF59. The radius of the curved surface of 227, the thickness of 227 and the length of 225 are chosen so that a bundle of parallel light entering 223 is focused on to the end of optic fiber 221 and the rays from the edge of the bundle strike the fiber. More particularly, these parameters a chosen so that the radius of the bundle of light divided by the focal length of the lens is equal to or greater than the numerical aperture of the fiber divided by the refractive index of the lower refractive index glass.

The collimators at the other end of the sensor 1 are similarly designed, but operate in the reverse direction to transform light received from the fiber optic cable into the bundle of parallel light which is passed through the first polarizer 211. This form of a collimator is necessary since in order to withstand the high electrical stresses during operation, and especially impulse tests, the insulator 201 is filled with oil or pressurized sulfur hexafluroide (SF6), and thus the optical system cannot have any glass air interfaces.

The system described in the '931 patent processes the output signal from sensor 1 to provide an output for presentation on an output device 79 shown in FIG. 2 of the patent which can have a digital readout or be a recorder. Thus the output of the system of the '931 patent can only be used for metering.

SUMMARY OF THE INVENTION

A system for measuring a high electric voltage on an electrical transmission line comprising:

an electro optical voltage transducer sensor connected between said electrical transmission line and ground for providing in response to said measured high electric voltage a Sin optical intensity signal and a Cos optical intensity signal; and a signal processor operating in a first state for digitally processing samples of said Sin and said Cos optical intensity signals to provide a representation of said high electric voltage on said transmission line that can be used for one or more of metering, relaying and transient capture.

DETAILED DESCRIPTION

Figure 4:
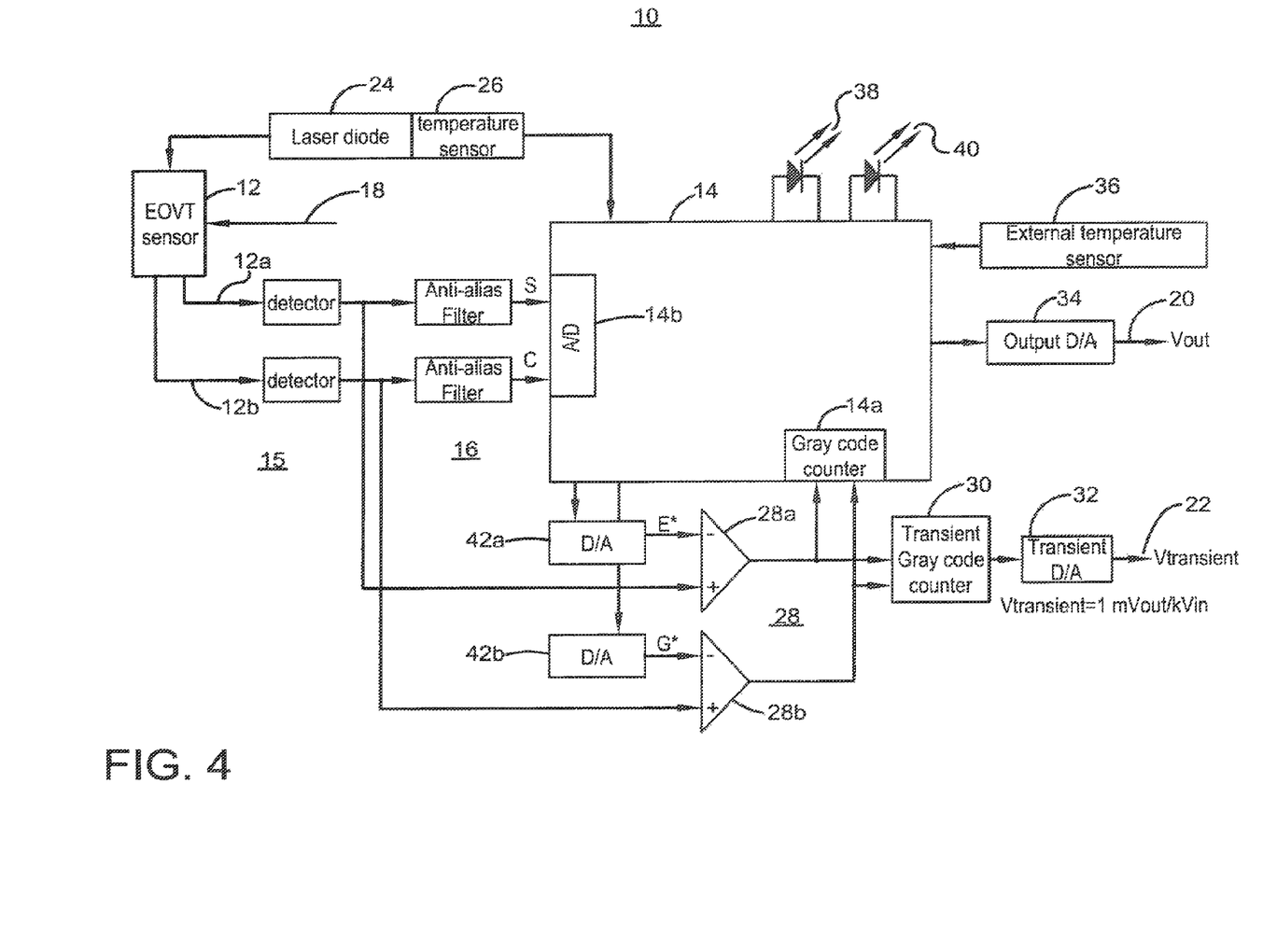
FIG. 4 shows one embodiment for the present EOVT signal processing system.

The block diagram of FIG. 4 shows one embodiment for the present EOVT signal processing system 10. System 10 produces an accurate reconstruction of the high voltage signals impressed across the EOVT sensor 12 which has a Bismuthgermanate ("BGO") crystal. The sensor contains an optical assembly with two outputs, the Sin optical intensity signal 12a and the Cos optical intensity signal 12b.

System 10 also includes signal processing electronics consisting of a digital signal processor (DSP) 14 and interface and conversion circuitry that is made up of two detectors collectively designated 15 in FIG. 4, two anti-alias filters collectively designated 16 in FIG. 4, D/A converters 42a and 42b, high speed SIN and COS comparators 28a and 28b respectively, transient Gray code counter 30, transient D/A converter 32 and Output D/A converter 34.

The signal processing electronics operates on the output optical intensity signals 12a and 12b and provides an accurate reconstruction, that is, a representation, of the high voltage input signal 18 to be used for one or more of metering, relaying, and the recording of transients that occur on the electrical transmission line. As is well known, metering is a measurement of energy usage and relaying is the operation of protective relays when a fault is detected.

System 10 outputs two reconstructed analog signals 20 and 22. Signal 20 provides a precision low level voltage scaled for revenue meters and protective relays. Signal 22 provides a low level voltage scaled for high voltage transient recording.

The hardware architecture, the DSP software architecture, and the DSP algorithms that produce the reconstructed signals are described below.

The Hardware Architecture

Sensor Input Signal

A 2 mW fiber-coupled power, 840 nm vertical cavity surface emitting laser (VCSEL) diode 24 provides the input optical signal to the sensor 12. The VCSEL 24 has a wavelength temperature coefficient that will produce an error in the reconstruction if left uncompensated. A temperature sensor 26 in close proximity to the VSCEL 24 provides a VCSEL temperature signal to the DSP 14 and an algorithm described below uses this signal to compensate the VCSEL wavelength temperature coefficient.

Sensor Output Signals

The EOVT sensor 12 produces two optical intensity signals 12a and 12b that are converted into the low level electrical signals S and C defined below;

$$S(Vin(t))=E+F \cdot \sin(\pi \cdot Vin(t)/V_h)$$

$$C(Vin(t))=G+H \cdot \cos(\pi \cdot Vin(t)/V_h)$$

The positive, quasi-static parameters E, F, G, and H have values that depend upon the sensor BGO crystal properties. Since S and C represent time varying intensities, F is always less than or equal to E and H is always less than or equal to G. The parameter $V_h$ represents the BGO crystal half wave voltage, approximately 50,000 V. Variable $V_{in}(t)$, a function of time, represents the high voltage input signal 18 and under normal conditions has a zero-offset sinusoidal waveform with 60 Hz frequency and amplitude much greater than $V_h$.

Figure 5:
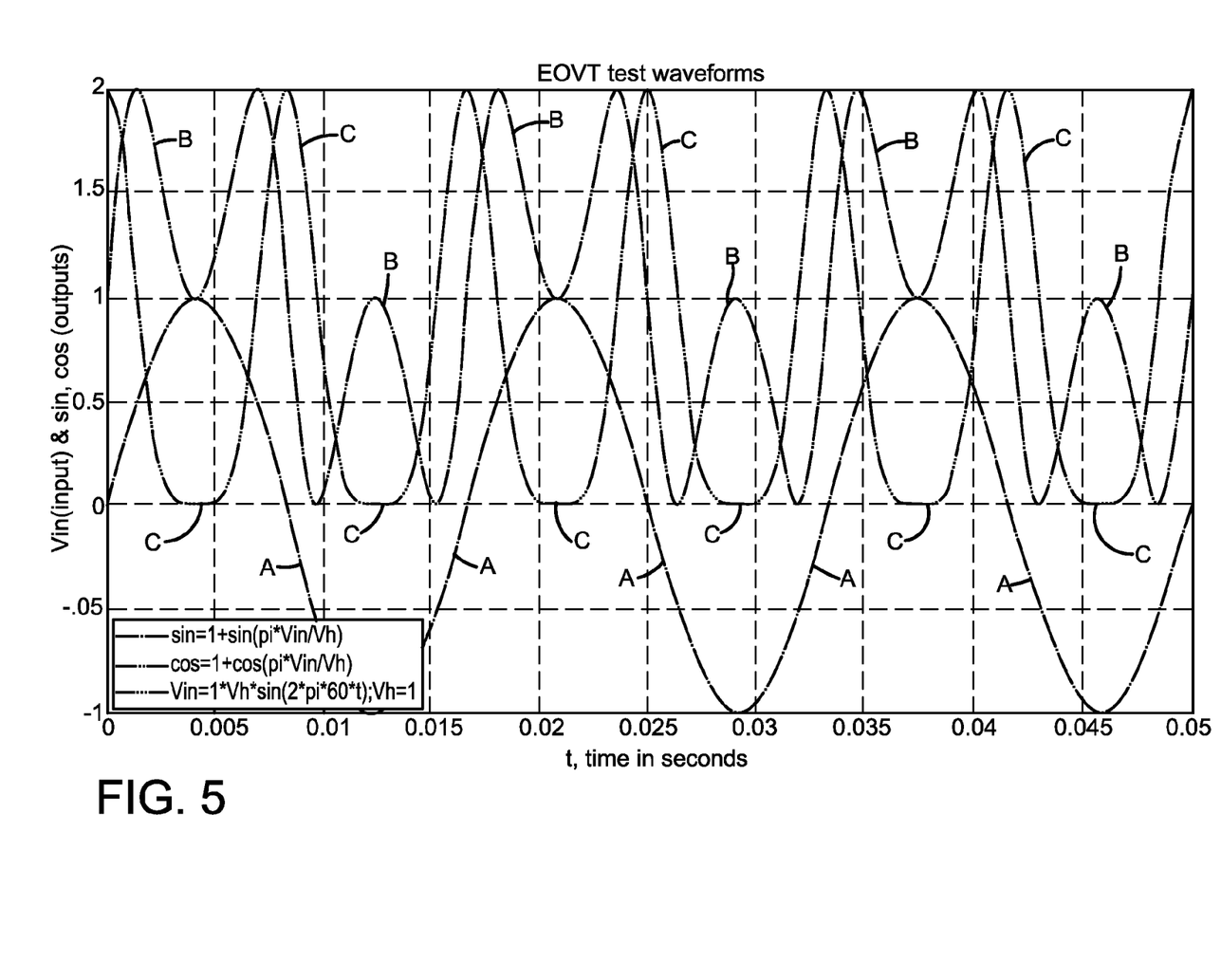
FIG. 5 shows a normalized plot of the EOVT sensor input voltage signal.

FIG. 5 shows a normalized (i.e. Vh=1, E=F=G=H=1) plot of the EOVT sensor input voltage signal 18 with amplitude equal to Vh (waveform A) and the sensor Sin (waveform B) and Cos (waveform C) optical intensity output signals 12a and 12b. For voltage signals with amplitude greater to or equal to Vh, both sensor signals 12a and 12b reach their respective maximum and minimum values. For voltage signals with amplitude less than Vh, one or both of the sensor signals does not achieve its minimum and/or maximum values.

If Vin(t) 18 has an amplitude greater than or equal to $V_h$, then the parameters E, F, G, and H can be computed as follows:

Find the maximum and minimum values of the Sin signal, Smax and Smin respectively.

$$Smax=E+F \text{ and } Smin=E-F.$$

$$E=(Smax+Smin)/2$$

$$F=(Smax-Smin)/2$$

Find the maximum and minimum values of the Cos signal, Cmax and Cmin respectively.

$$Cmax=G+H \text{ and } Cmin=G-H.$$

$$G=(Cmax+Cmin)/2$$

$$H=(Cmax-Cmin)/2$$

Detectors

Detectors 15 convert the SIN and COS optical intensity signals 12a and 12b into low level analog voltages compatible with the DSP A/D converter 14 and the high speed SIN and COS comparators collectively designated 28 in FIG. 4. Each detector contains a two-stage 20 MHz bandwidth transimpedence amplifier driven by a PIN diode (not shown) that converts light (optical intensity) into current. This bandwidth enables capture of high speed input voltage transients including the 800 KV rated front end basic impulse level ("BIL") waveforms (2050 kV) as defined in IEC 71-1.

The BIL test waveform for an 800 kV system produces a 2050 kV peak transient with a 1.2 microsecond rise time and 50 microsecond decay to 50% of its peak value. Using the standard definitions for the BIL waveform, the voltage slew rate from the 30% to 90% point in the BIL waveform (the linear region of the front end and the worst case slew rate condition) equals approximately 1078 kV in 0.72 microseconds or 1497 kV/microsecond and produces a burst of 17.1 MHz Sin and Cos intensity signals 12a and 12b.

Anti-Alias Filters

The DSP 14 samples each of the Sin and Cos optical intensity signals at 500 kHz. In order to prevent aliasing of noise above the Nyquist sampling frequency (250 kHz), 2-pole low pass Butterworth active filters 16 with 141 kHz cutoff frequency filter each intensity signal prior to DSP sampling.

Digital Signal Processor

The DSP 14, which is an Analog Devices BF506F, executes the signal processing algorithms described below. The DSP 14 contains a rich set of integrated peripherals including a dual, 3/6 channel 12-bit A/D converter 14b, a gray code (or quadrature) configurable counter 14a, timers, serial ports, and parallel port interfaces.

High Speed Comparators

Each intensity signal drives a high speed comparator 28a and 28b offset by a D/A signal from a respective D/A converter 42a and 42b representing the DSP computed estimate of its average value (E and G for the Sin and Cos intensity, respectively). Each of the comparators 28a and 28b produces a digital waveform with a logic one representing the instantaneous value of the intensity waveform above its average value and a logic zero representing the instantaneous value of the intensity signal below its average value. Increasing high voltage input signals creates comparator digital output waveforms with the Sin signal lagging the Cos signal by 90° and decreasing high voltage input signals create comparator output signals with the Sin leading the Cos by 90°.

With the Sin comparator 28a in the most significant bit position and the Cos comparator 28b in the least significant bit position, the comparators 28a and 28b produce a repeating 10 to 11 to 01 to 00 2-bit gray code pattern for increasing high voltage input signals (called a positive transition pattern) and produce a repeating 10 to 00 to 01 to 11 2-bit gray code pattern for decreasing high voltage input signals (called a negative transition pattern). Each bit pattern change corresponds to a change in the high voltage input signal equal to Vh/2.

The comparators collectively designated 28 in FIG. 4 have greater than 50 MHz bandwidth making them compatible with the 17.1 MHz frequency burst output from the detectors during an 800 kV BIL transient. The comparators 28 also contain a small amount of hysteresis to prevent output oscillations during slow signal transitions and provide some immunity to additive noise in the signals.

DSP Gray Code Counter

The DSP 14 contains an integrated 2-bit Gray code counter 14a driven by the high speed comparator outputs and has a bandwidth compatible with the Gray code output from the comparators 28 during an 800 kV BIL transient. The counter 14a is incremented by one bit for each positive transition and is decremented by one bit for each negative transition. An algorithm periodically reads the contents of the Gray code counter 14a during execution of the Transient processing algorithm described below.

Transient Gray Code Counter and Transient D/A

An electrically programmable logic device (EPLD) contains a 2-bit transient gray code counter 30 driven by the high speed comparator outputs and has a bandwidth compatible with an 800 kV BIL transient. The DSP 14 periodically synchronizes the zero crossing of the transient output with the zero crossing of the output D/A 34, except during transient conditions. The output of the transient gray code counter 30 drives the input of a transient digital to analog converter 32 and together produces an output signal scaled at 1 mV per 1000 V of high voltage signal with a resolution of Vh/2 (approximately 25,000 volts) and a peak to peak value of 8 volts (±4 volts).

Output D/A

The output D/A circuit 34 converts the DSP reconstruction algorithm output into an analog signal 20 with the output scaled to 4 volts RMS at the rated RMS high voltage input. The circuit 34 includes an analog lead network to compensate for any phase lag between the reconstructed waveform and the high voltage input signal.

External Temperature Sensor

The EOVT sensor half wave voltage, $V_h$, has an approximate $-1.5\%/100°$ C. temperature coefficient that degrades the voltage reconstruction accuracy if left uncompensated. An external temperature sensor 36 located in close proximity to the EOVT sensor 12 provides an EOVT sensor temperature signal to the DSP and a DSP algorithm, described below, uses this signal to compensate for the sensor half wave voltage temperature coefficient.

Status LEDs

DSP algorithms continuously test the condition of some of the electronics hardware and control the color of a front panel electronics status light emitting diode (LED) 38 to indicate a passing condition (green) or a failed condition (red). Other DSP algorithms continuously test the condition of the optical path and control the color of a front panel optics status LED 40 to indicate a passing condition (green) or a failed condition (red).

The Software Architecture

Figure 6:
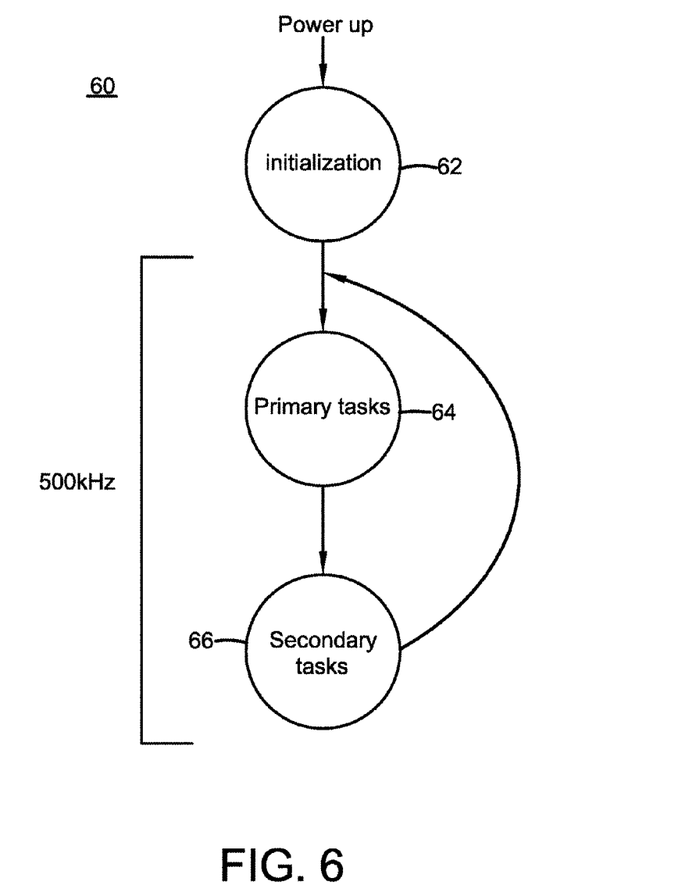
FIG. 6 shows a flow diagram of the software architecture in the digital signal processor in the system in FIG. 4.

The DSP 14 executes all of the software. FIG. 6 shows a flow diagram 60 of the software architecture. Upon application of power, the DSP 14 executes initialization software 62. The initialization software configures all of the peripherals integrated into the DSP 14 including the A/D converters, timers, counters, serial communications devices, parallel ports, and internal phase lock loop used to establish internal clock frequencies. Initialization software configures and initializes parameter estimator digital filters and creates an arctangent lookup table used by the fine reconstruction algorithm. Initialization sets up an internal timer to provide a 500 kHz signal. This signal immediately causes the two 12-bit A/D converters 14b to sample and convert the Sin and Cos intensity signals simultaneously.

Upon completion of Initialization the software polls the internal timer 500 kHz signal. A true timer signal causes the software to execute the primary tasks 64 and secondary tasks 66. The software executes all of the primary tasks within one 500 kHz period. The primary tasks 64 read the A/D converters that contain the digitized samples of the Sin and Cos intensity signals 12a and 12b, execute the reconstruction and temperature compensation algorithms, scale the reconstructed signal to the output D/A 34, and write the result to the output D/A 34.

The secondary tasks 66 are divided into 16 unique subtasks called time slices. Only one of the 16 time slices is executed after exiting the primary tasks 64. The time slices are executed in sequential order starting with zero and ending with 15. Therefore, each time slice is executed at a 500 kHz/16=31.25 kHz rate. Secondary tasks 66 include the parameter estimation algorithm, all background serial communications tasks, the state machine algorithm, and other algorithms that support the execution of the state machine.

DSP Algorithms

Parameter Estimator

The parameter estimator algorithm provides estimates of E, F, G, and H labeled E*, F*, G*, and H* respectively from the 500 KHz samples of S and C. The algorithm first digitally low pass filters the S and C samples by accumulating 16 samples each of S and C and labeling them Savg and Cavg respectively. The algorithm then searches for the maximum and minimum value of Savg over one power line cycle labeling them Smaxc and Sminc respectively and maximum and minimum value of Cavg over one power line cycle labeling them Cmaxc and Cminc respectively. The algorithm then digitally low pass filters at a 60 Hz sampling rate Smaxc, Sminc, Cmaxc, and Cminc producing filtered results Smaxf, Sminf, Cmaxf, and Cminf respectively. Finally, the algorithm computes E*, F*, G*, and H* from the outputs of the low pass filters as shown below:

$$E^* = (Smaxf + Sminf)/2$$

$$F^* = (Smaxf - Sminf)/2$$

$$G^* = (Cmaxf + Cminf)/2$$

$$H^* = (Cmaxf - Cminf)/2$$

The algorithm accounts for two special conditions.

Condition 1: If power is applied to the signal processing system with an input high voltage signal less than Vh, the low pass filters are supplied with factory-measured values of Smaxc, Sminc, Cmaxc, and Cminc that were obtained and stored in memory while the system was characterized with input voltage well above Vh.

Condition 2: During operation with the input high voltage above Vh, the algorithm computes valid Smaxf, Sminf, Cmaxf, and Cminf values and it stores the values that are computed at the time the input falls below Vh for use as future inputs to the low pass filters during the time the input remains below Vh.

Reconstruction Algorithm

The DSP 14 executes a coarse, fine, and transient reconstruction algorithm. The output D/A 34 outputs a signal that represents the sum of the coarse and fine reconstruction algorithm results during non-transient conditions and outputs the transient algorithm result during a transient.

Coarse

The coarse reconstruction algorithm computes a 2-bit gray code from each 500 KHz S and C sample output from the DSP on-board A/D converters 14b and uses this code to update the contents of a software gray code counter 14a. The algorithm computes a two bit gray code from the samples of S and C by comparing them to E* and G* respectively as shown in the table below,

|     | C ≥ G* | C < G* |
| --- | --- | --- |
| S ≥ E* | 11 | 10 |
| S < E* | 01 | 00 |

The resulting gray code then updates a software gray code counter 14a. During positive dVin(t)/dt, the gray code counts up once every Vh/2 transition and during negative dVin(t)/dt the counter counts down once every Vh/2 transition. An offset may exist in the counter since the coarse reconstruction is completely asynchronous with the input signal. An offset compensation algorithm measures and removes this offset.

Fine

The fine reconstruction algorithm computes a fine addition to the contents of the 2-bit software gray code counter 14a based upon the following equations:

$$Sac = S - E^*$$

$$Cacn = (C - G^*)(F^*/H^*)$$

$$Vin = (Vh/\pi) \cdot \arctan(Sac/Cacn)$$

The first equation removes the estimate of the DC value of the SIN intensity signal 12a from the signal, leaving the AC component, Sac. The second equation removes the estimate of the DC component of the COS intensity signal 12b from the signal and equalizes the AC component to that of the SIN intensity signal, leaving an equalized AC component, Cacn. The last equation computes Vin, the fine addition to the software gray code counter 14a. This equation recognizes that the arctangent of the ratio of Sac and Cacn yields the argument of the SIN and COS intensity signal or $\pi \cdot Vin(t)/Vh$.

Multiplying the arctangent result by $Vh/\pi$ produces Vin (t), which is added directly to the coarse reconstruction algorithm result. The fine reconstruction algorithm uses a lookup table to estimate the arctangent of the ratio Sac/Cacn.

Transient

Transient input voltage conditions may create optical intensity signals with frequencies above the anti-alias filter bandwidth and cause the coarse reconstruction algorithm software gray code counter 14a to lose count of Vh/2 transitions during the transient. This condition can create an error in the output D/A 34 that is only slowly removed over time. The transient algorithm eliminates the error and slow recovery time and maintains reconstruction accuracy for metering and relaying after the transient condition expires.

The transient algorithm reads the contents of the DSP on-board hardware gray code counter 14a at the same 500 KHz rate the detector samples are taken. This counter has a bandwidth compatible with the bandwidth of the detectors 15, enabling the DSP 14 to capture transients. The algorithm measures the dwell time at any gray code (with 2 microsecond resolution) and triggers the transient sub-state if it is less than a programmable setpoint.

For example, an 800 kV/√3 60 Hz high voltage signal creates a maximum intensity signal frequency of approximately 2.5 kHz (in the neighborhood of the zero crossing) creating minimum gray code dwell times equal to approximately 100 microseconds. Therefore, the programmable setpoint must have a value less than 100 microseconds.

During the transient sub-state, the DSP 14 updates the software quadrature counter by adding the change in hardware quadrature counter readings from one sample to the next. Also, during the transient state, no fine reconstruction is computed.

Once in the transient sub-state, the algorithm exits it after approximately one power line cycle of consecutive gray code dwell times greater than the programmable setpoint that caused entry into the transient sub-state.

Offset Compensator

The offset compensator consists of a low bandwidth filter that estimates the offset in the reconstructed signal and subtracts it from the reconstructed signal before it is output to the output D/A converter 34. The offset compensator is disabled during the transient sub-state.

State Machine

Figure 7:
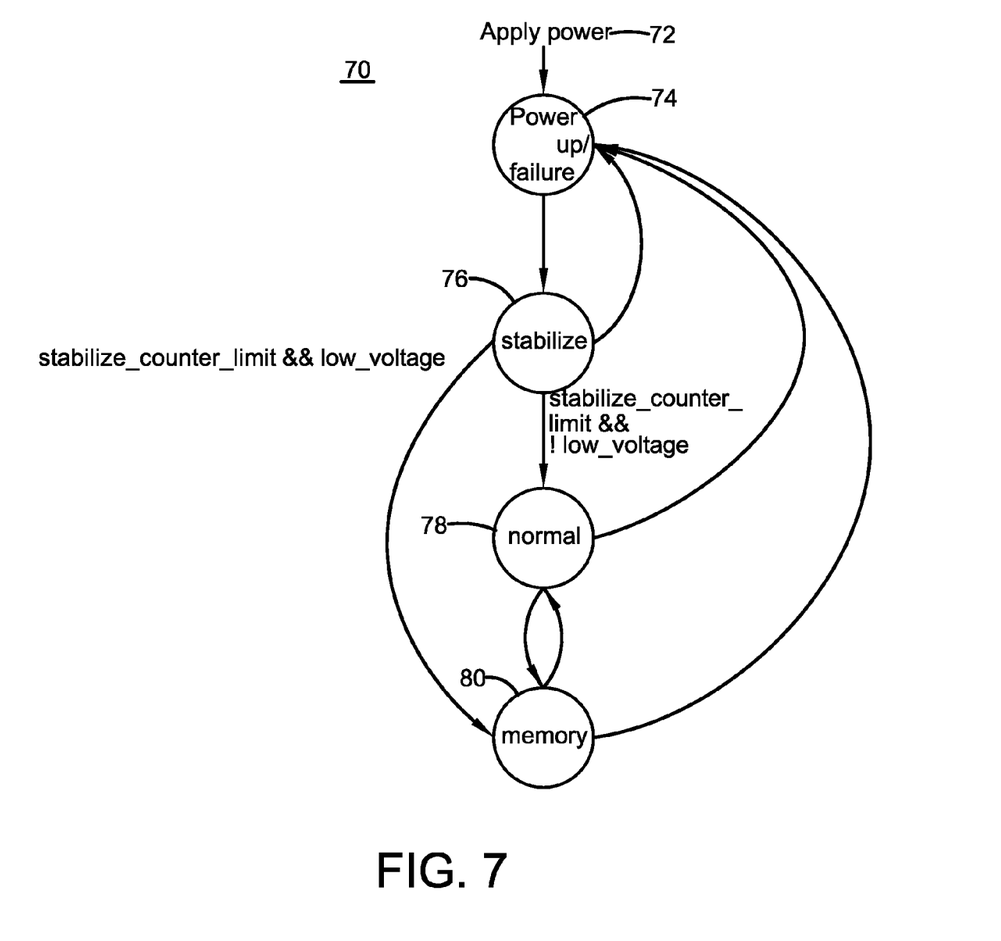
FIG. 7 shows a bubble diagram for the state machine algorithm that controls the overall operation of the signal processing in the system of FIG. 4.

The state machine algorithm 70, shown in the FIG. 7 bubble diagram, controls the overall operation of the signal processing. After applying power 72, the system enters the POWER UP/FAILURE state 74 where it undergoes a comprehensive power up built in test (BIT) and tests the amplitude of the sin and cosine optical intensity signals. BIT test failure or low amplitude sin or cosine optical intensity signal detection (a true optical_signal_failure flag) keeps the system in this state which zeros the reconstructed voltage output. Successful BIT test completion and sin and cosine optical intensity signals with sufficient amplitude transitions the state machine to the STABILIZE state 76.

The POWER UP/FAILURE state 74 also initializes the estimates of E, F, G, and H with values found during factory calibration providing a best estimate of these parameters in case the system 10 is powered up with a peak high voltage input below the half wave voltage of the BGO crystal (a true low_voltage flag). The POWER UP/FAILURE state 74 sets the reconstructed voltage output signals to zero.

The STABILIZE state 76 provides a fixed period of time for the parameter estimator digital low pass filters to stabilize (approximately four seconds) and to develop an average value of the software gray code counter over a power line cycle. At any time in the STABILIZE state 76, a continuous BIT test failure or a true optical_signal_failure flag forces an immediate transition to POWER UP/FAILURE state 74. At the end of the fixed period of time, the state machine transitions to NORMAL state 78 if the low_voltage flag is false or transitions to the MEMORY state 80 if low voltage is true. The state machine 70 also subtracts the average value of the software gray code counter 14a from the current value of the counter which eliminates the coarse offset in the reconstructed signal. The STABILIZE state 76 sets the reconstructed voltage output signals to zero.

The NORMAL state 78 provides reconstructed high voltage signal outputs using samples of the sin and cosine intensity signals and real time updates of the parameter estimates output from the parameter estimator digital filters. At any time in the NORMAL state 78, a continuous BIT test failure or a true optical_signal_failure flag forces an immediate transition to the POWER UP/FAILURE state 74. Also, detection of a low input voltage condition (a true low_voltage flag) causes memorization of the parameter estimates and forces a transition to the MEMORY state 80.

The MEMORY state 80 provides reconstructed high voltage output signals using samples of the sin and cosine intensity signals 12a and 12b and memorized values of the parameter estimates output from the parameter estimator digital low pass filters. The MEMORY state 80 uses parameter estimates determined during factory test if the prior state was the STABILIZE state 76 or uses memorized parameter estimates from the NORMAL state 78 if the prior state was the NORMAL state 78. At any time in the MEMORY state 80, a continuous BIT test failure or a true optical_signal_failure flag forces an immediate transition to the POWER UP/FAILURE state 74. Detection of a normal input voltage condition (a false low_voltage flag) causes forces a transition to the NORMAL state 78.

In any state, a BIT test failure forces the ELECTRONICS STATUS front panel LED 38 indicator to red and green otherwise. Similarly, a true optical_signal_failure flag forces the OPTICS STATUS front panel LED indicator 40 to red and green otherwise.

Low Input Voltage Signal Detection

The signal processing system 10 reconstructs the high voltage input signal using Sin and Cos intensity signal parameter estimates continuously calculated during normal operation. Normal operation has an input signal above the EOVT sensor half wave voltage, Vh. Valid parameter estimates can be calculated with input high voltage signal amplitudes down to Vh. Below this, the signal processing uses valid parameter estimates memorized at the time the input amplitude dropped below Vh. This document defines the algorithm that detects the input signal low voltage condition.

Sin Intensity Signal Analysis

The algorithm uses the Sin intensity signal, Equation 1, to detect the presence of the low amplitude high voltage signal condition.

$$S(t) = E + F \cdot \sin(\pi \cdot Vin(t)/Vh);$$ Equation 1

Figure 8:
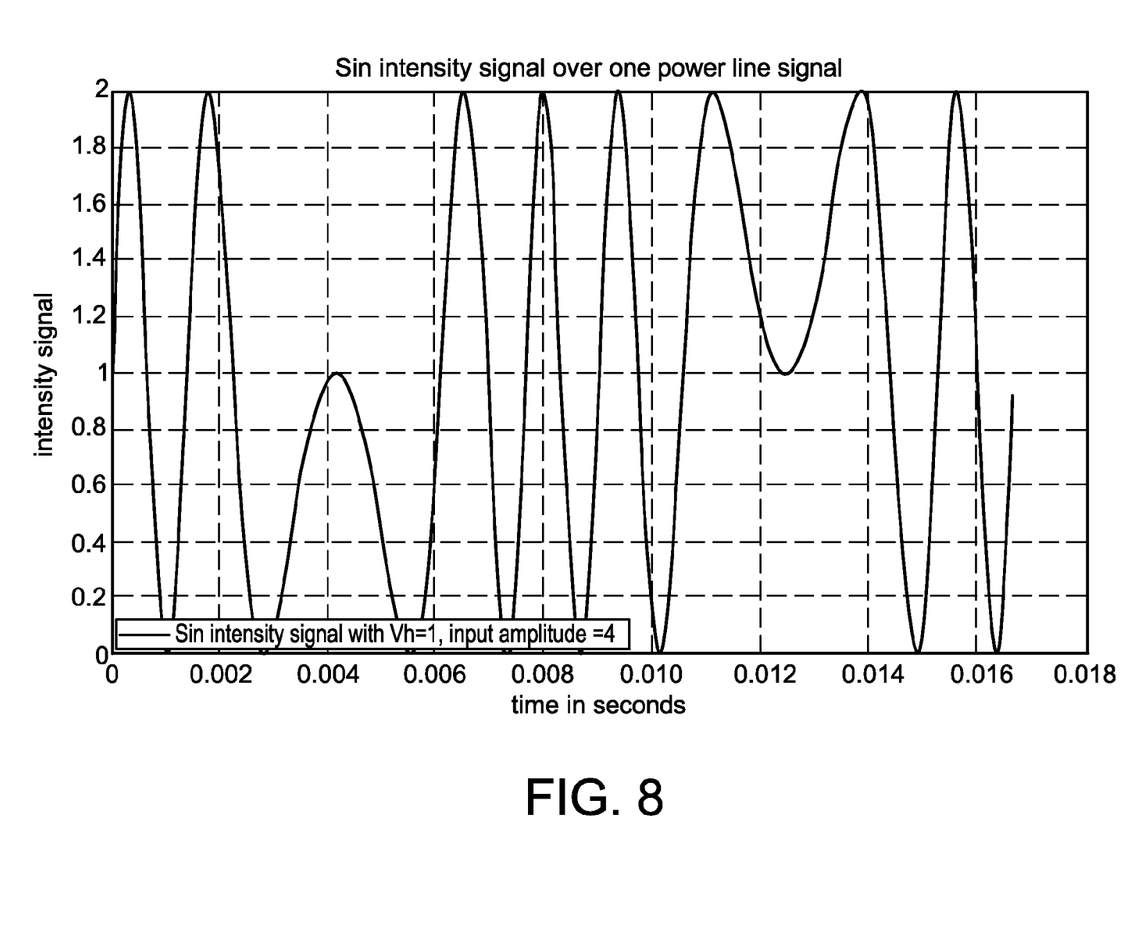
FIG. 8 shows a plot of Sin intensity signal with normalized parameters and high voltage input signal amplitude equal to a predetermined amplitude.

A parameter estimation algorithm computes estimates of E and F with E representing the average value of the Sin intensity waveform over a power line cycle, at any amplitude signal value. FIG. 8 shows a plot of Sin intensity signal with normalized parameters (i.e. E=F=Vh=1) and high voltage input signal amplitude equal to 4×Vh=4. The signal ranges from E+F=2 to E−F=0 and the average value over a power line cycle period equals E or 1. The Sin signal changes its sign, relative to its average value E, more than 12 times.

Figure 9:
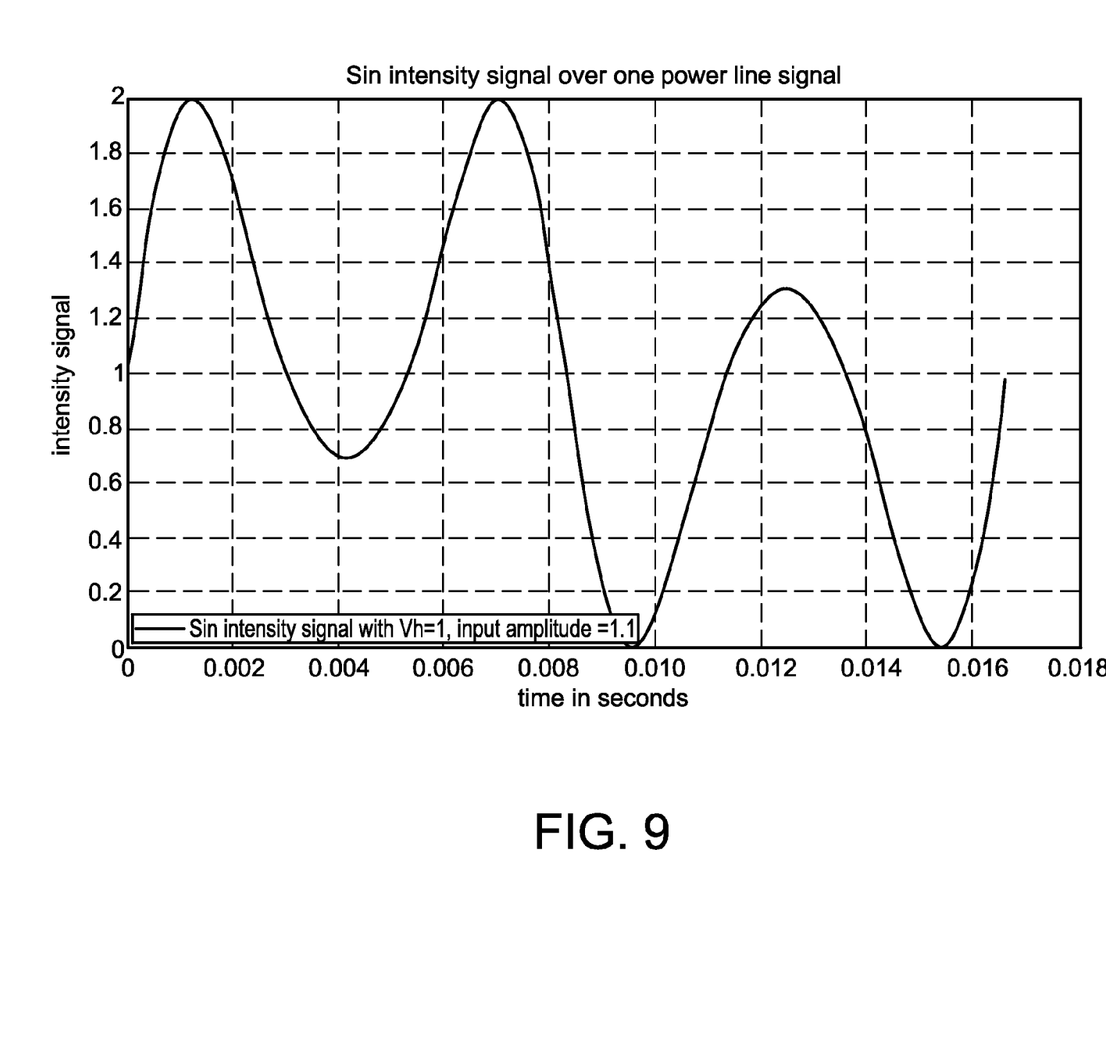
FIG. 9 shows the Sin intensity signal with the same normalized parameters as in FIG. 8 and high voltage input signal amplitude equal to a predetermined amplitude that is different than the predetermined amplitude in FIG. 8.

FIG. 9 shows the Sin intensity signal with the same normalized parameters and high voltage input signal amplitude equal to 1.1×Vh=1.1. The signal ranges from E+F=2 to E−F=0 and the average value over a power line cycle period equals E or 1. The Sin signal changes its sign, relative to its average value E, more than 4 times.

Figure 10:
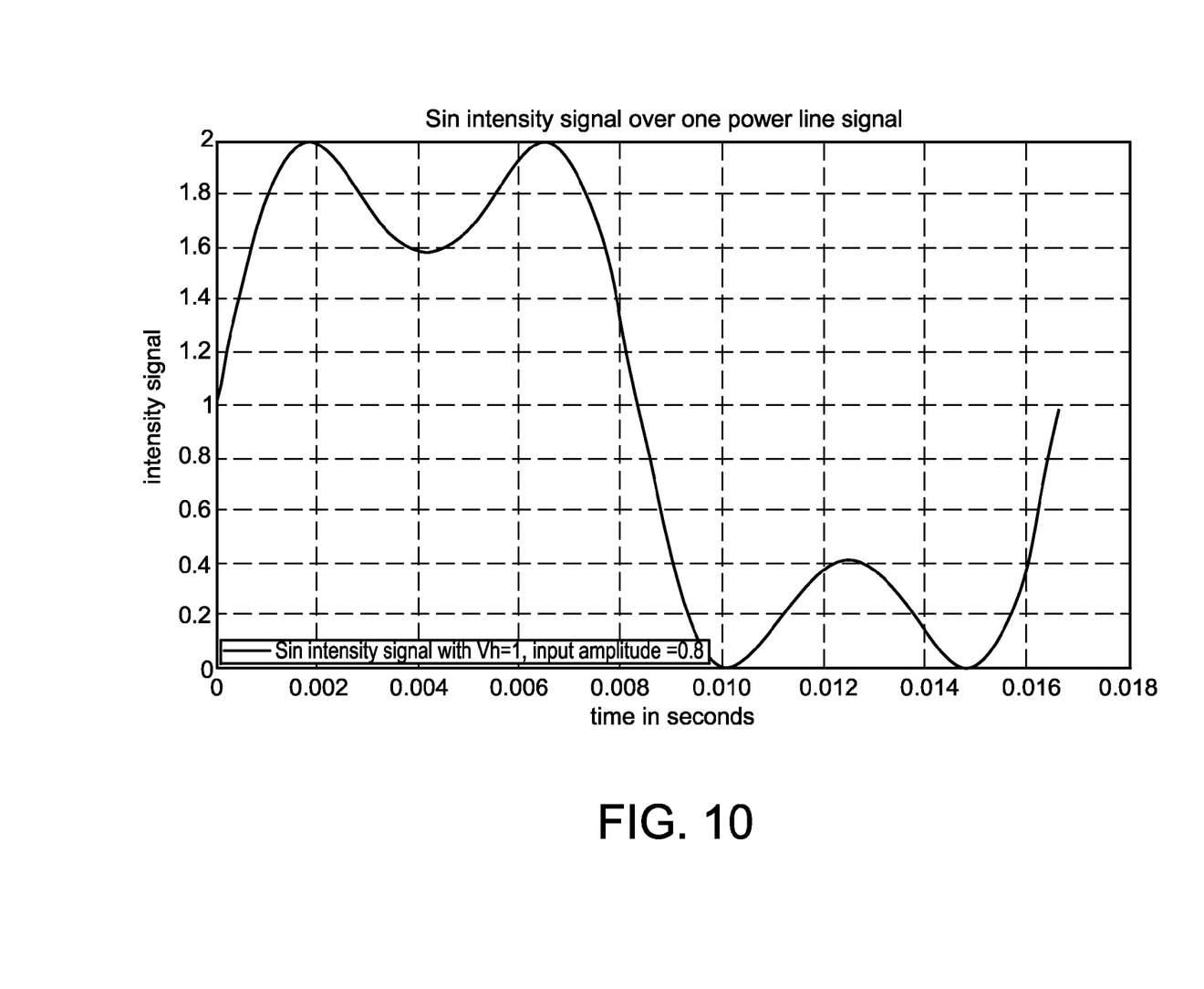
FIG. 10 shows the Sin intensity signal with the same normalized parameters as in FIG. 8 and high voltage input signal amplitude equal to an predetermined amplitude that is different than the predetermined amplitudes in FIGS. 8 and 9.

It can be shown that with high voltage input signal amplitudes less than Vh, the Sin intensity signal changes sign only once, relative to its average value or parameter E, over a power line cycle period. FIG. 10 shows the Sin intensity signal with the same normalized parameters and high voltage input signal amplitude equal to 0.8×Vh=0.8. The average value over a power line cycle period equals E or 1 and the Sin signal changes its sign, relative to its average value E, only once.

Algorithm

The algorithm continuously computes a one power line cycle (1/60 Hz) estimate of the average value of the Sin intensity signal and compares it to each sample of the Sin intensity signal over a power line cycle. The algorithm counts the number of times the Sin intensity signal crosses its average value over one power line cycle. A count less than or equal to three indicates a low amplitude high voltage signal, providing a form of noise filtering for signals near Vh. The algorithm also includes some hysteresis in the comparison providing additional noise filtering. Note that the parameter estimate E is not used since it is frozen to a memorized value during low amplitude high voltage input conditions.

Temperature Compensation

The voltage reconstruction algorithm uses a fixed value for the half wave voltage, Vh, and produces an output directly proportional to it. However, Vh possesses two temperature dependencies which degrade reconstruction accuracy if left uncompensated.

The BGO crystal in the sensor possesses a linear material half wave voltage temperature coefficient equal to approximately −1.5%/100° C. The crystal half wave voltage also possesses a linear light source wavelength dependency. Since the light source wavelength varies linearly with temperature this wavelength dependence is converted into a second temperature dependency. Equation 1 represents the linear approximation to the half wave voltage as a function of the material temperature, $T_\pi$, and the light source wavelength temperature dependence, $T_\lambda$, about the material and light source operating temperature points $T_{\pi 0}$ and $T_{\lambda 0}$ (This is a Taylor series of a function of two variables limited to first order).

$$V_h(T_m, T_\lambda) = V_h(T_{m0}, T_{\lambda 0}) + (T_m - T_{m0}) \cdot \partial V_h(T_{m0}, T_{\lambda 0})/\partial T_m + (T_\lambda - T_{\lambda 0}) \cdot \partial V_h(T_{m0}, T_{\lambda 0})/\partial T_\lambda$$ Equation 1

Dividing Equation 1 by $V_h(T_{mo}, T_{\lambda 0})$ and converting the partial derivatives into simple differentials yields Equation 2.

Equation 2

$$\frac{V_h(T_m, T_\lambda)}{V_h(T_{m0}, T_{\lambda 0})} = 1 + (T_m - T_{m0}) \cdot \frac{\Delta V_h(T_{m0}, T_{\lambda 0})/V_h(T_{mo}, T_{\lambda 0})}{\Delta T_m} + (T_\lambda - T_{\lambda 0}) \cdot \frac{\Delta V_h(T_{m0}, T_{\lambda 0})/V_h(T_{m0}, T_{\lambda 0})}{\Delta T_\lambda}$$

Equation 2 may be further simplified into

Equation 3 with $C_m$ representing the material temperature coefficient equal to $-1.5 \times 10^{-4}$ and $C_\lambda$ representing the light source wavelength temperature dependency coefficient, derived as described below.

Equation 3

$$\frac{V_h(T_m, T_\lambda)}{V_h(T_{m0} \cdot T_{\lambda 0})} = 1 + (T_m - T_{m0}) \cdot C_m + (T_\lambda - T_{\lambda 0}) \cdot C_\lambda$$

The temperature compensation algorithm multiplies the reconstructed voltage signal by Equation 3 effectively replacing the stored constant Vh=Vh($T_{m0}$, $T_{\lambda 0}$) with the temperature modified value $V_h(T_m, T_\lambda)$. This corrects for any changes in Vh due to material temperature changes or light source wavelength changes.

During factory calibration which is conducted in a stable and controlled environment, temperature compensation is disabled and the reconstructed voltage signal is scaled to yield the correct ratio of output to input voltage. At the end of factory calibration, the system memorizes both the material temperature and the light source temperature, establishing $T_{m0}$, $T_{\lambda 0}$, and Vh ($T_{m0}$, $T_{\lambda 0}$)

Light Source Wavelength Compensation

The value of the EOVT sensor 12 BGO crystal half wave voltage, $V_h$, possesses a light source wavelength dependency. The sensor light source, a vertical cavity surface emitting laser (VCSEL) 24, has a wavelength temperature coefficient which makes the half wave voltage a function of the VCSEL temperature and degrades the voltage reconstruction accuracy if left uncompensated.

Equation 4 defines the relationship between the BGO half wave voltage, Vh, and the wavelength λ in meters, the index of refraction $n_0$, and the Pockels coefficient for BGO, $r_{41}$.

Equation 4

$$V_h = \frac{\lambda}{2 \cdot n_0^3 \cdot r_{41}} = K_1 \cdot \lambda;$$

The index of refraction equals 2.07 around the wavelength of interest and the Pockels coefficient equals $1.03 \times 10^{12}$ meters/volt. Constant $K_1$ equals $54.73 \times 10^9$ volts/meter and at $\lambda=850$ nm, Vh=46,520 volts. The half wave voltage wavelength sensitivity can be expressed as Equation 5.

Equation 1

$$\frac{dV_h}{d\lambda} = K_1 = 54.73 \cdot 10^9, \text{volts/meter}; \quad \text{Equation 5}$$

The VCSEL (for example, Zarlink part number ZL60001) has a wavelength temperature coefficient, $K_2$, equal to $0.06 \times 10^{-9}$ meters/° C. which can be expressed as Equation 6.

Equation 6

$$\frac{d\lambda}{dT} = K_2 = 0.06 \cdot 10^{-9}, \text{meters/° C.}; \quad \text{Eq 6}$$

Multiplying Equation 5 by Equation 6 produces Equation 7, the expression for the half wave voltage VCSEL temperature coefficient.

Equation 7

$$\frac{dV_h}{dT} = \frac{dV_h}{d\lambda} \cdot \frac{d\lambda}{dT} = K_1 \cdot K_2 = 3.284, \text{volts/° C.}; \quad \text{Eq 7}$$

For a 100° C. temperature change with respect to a reference temperature, the temperature coefficient equals 0.706% or 0.706%/100° C.=$7.06 \times 10^{-5}$ and represents $C_\lambda$ in Equation 3.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A system for measuring a high electric voltage on an electrical transmission line comprising:
   an electro optical voltage transducer sensor connected between said electrical transmission line and ground for providing, in response to said measured high electric voltage, (1) a sine (Sin) optical intensity signal, and (2) a cosine (Cos) optical intensity signal; and
   a signal processor operating in a first state for digitally processing samples of said Sin and said Cos optical intensity signals to provide a representation of said high electric voltage on said transmission line that can be used for one or more of metering, relaying and transient capture wherein said signal processor operating in said first state continuously calculates and memorizes parameters of said Sin and said Cos optical intensity signals when said system is providing said representation of said measured high electric voltage on said voltage electrical transmission, said signal processor operating in a second state when a low voltage fault is detected on said electrical transmission line to provide from said memorized parameters and samples of said Sin and said Cos optical intensity signals a representation of what said high electric voltage would be in the absence of said detected low voltage fault to be used for one or more of metering, relaying and transient capture.

2. The system of claim 1 wherein said signal processor has first and second independent outputs and provides from said representation of said high electric voltage at said first output a voltage scaled for metering and at said second output a voltage scaled for transient capture.

3. The system of claim 2 wherein scaled voltage at said first output that can also be used for relaying.

4. The system of claim 1 wherein said signal processor uses the arctangent of the ratio of said Sin and said Cos optical intensity signals to provide said representation of said high electric voltage on said voltage electrical transmission line.

5. The system of claim 1 wherein said signal processor operating in said first state digitally processes said samples of said Sin and said Cos optical intensity signals to provide a representation of said high electric voltage on said transmission line that can be used for metering and relaying.

6. The system of claim 5 wherein said signal processor prevents said representation of said high electric voltage on said transmission line that can be used for metering and relaying from producing an offset error during an occurrence of a transient on said electrical transmission line.

7. A system for measuring a high electric voltage on an electrical transmission line comprising:
   an electro optical voltage transducer sensor connected between said electrical transmission line and ground for providing, in response to said measured high electric voltage, (1) a sine (Sin) optical intensity signal, and (2) a cosine (Cos) optical intensity signal;
   a signal processor operating in a first state for digitally processing samples of said Sin and said Cos optical intensity signals to provide a representation of said high electric voltage on said transmission line that can be used for one or more of metering, relaying and transient capture; and
   a detector for converting said Sin optical intensity signal and a detector for converting said Cos optical intensity signal into an associated current, each of said detectors having a bandwidth sufficient to enable capture of high voltage transients on said electrical transmission line, wherein said high voltage transients include the 800 KV rated front end basic impulse level waveforms.

8. The system of claim 7 wherein said signal processor has first and second independent outputs and provides from said representation of said high electric voltage at said first output a voltage scaled for metering and at said second output a voltage scaled for transient capture.

9. The system of claim 8 wherein scaled voltage at said first output that can also be used for relaying.

10. The system of claim 7 wherein said signal processor uses the arctangent of the ratio of said Sin and said Cos optical intensity signals to provide said representation of said high electric voltage on said voltage electrical transmission line.

11. The system of claim 7 wherein said signal processor operating in said first state digitally processes said samples of said Sin and said Cos optical intensity signals to provide a representation of said high electric voltage on said transmission line that can be used for metering and relaying.

12. The system of claim 11 wherein said signal processor prevents said representation of said high electric voltage on said transmission line that can be used for metering and relaying from producing an offset error during an occurrence of a transient on said electrical transmission line.

* * * * *